(12) United States Patent
Regimbal et al.

(10) Patent No.: US 8,867,696 B2
(45) Date of Patent: Oct. 21, 2014

(54) FRACTIONAL FREQUENCY DIVIDER

(75) Inventors: Nicolas Regimbal, Grenoble (FR); Franck Badets, Voiron (FR); Yann Deval, Bordeaux (FR); Jean-Baptiste Begueret, Merignac (FR)

(73) Assignees: STMicroelectronics S.A., Montrouge (FR); STMicroelectronics (Grenoble 2) SAS, Grenoble (FR); Centre National de la Recherche Scientifique, Paris (FR)

( * ) Notice: Subject to any disclaimer, the term of this patent is extended or adjusted under 35 U.S.C. 154(b) by 220 days.

(21) Appl. No.: 13/172,491

(22) Filed: Jun. 29, 2011

(65) Prior Publication Data
US 2012/0001665 A1  Jan. 5, 2012

(30) Foreign Application Priority Data

Jun. 30, 2010 (FR) .................... 10 02739

(51) Int. Cl.
*H03K 21/00* (2006.01)
*H03K 5/156* (2006.01)
*H03K 21/10* (2006.01)
*H03K 23/66* (2006.01)
*H03K 23/68* (2006.01)

(52) U.S. Cl.
CPC .............. *H03K 5/156* (2013.01); *H03K 21/10* (2013.01); *H03K 23/662* (2013.01); *H03K 23/68* (2013.01)
USPC .............................. 377/48; 327/115; 327/117

(58) Field of Classification Search
CPC ..... H03K 23/662; H03K 23/68; H03K 21/10; G06F 7/68
USPC ....................... 327/113–115, 117; 377/47, 48
See application file for complete search history.

(56) References Cited

U.S. PATENT DOCUMENTS

| | | | |
|---|---|---|---|
| 6,064,241 A | 5/2000 | Bainton et al. | |
| 7,098,715 B2 * | 8/2006 | Severson | 327/291 |
| 2008/0269928 A1 * | 10/2008 | May | 700/94 |
| 2009/0128198 A1 | 5/2009 | Badets et al. | |

FOREIGN PATENT DOCUMENTS

WO   WO 2004068706 A2   8/2004

OTHER PUBLICATIONS

French Search Report dated May 20, 2011 from corresponding or related French Application No. 10/02739.

* cited by examiner

*Primary Examiner* — Patrick O'Neill
(74) *Attorney, Agent, or Firm* — Wolf, Greenfield & Sacks, P.C.

(57) ABSTRACT

A fractional frequency divider including a frequency division unit for generating a reduced frequency timing signal having j pulses for every k pulses of an original timing signal, wherein j and k are each integers; and phase correction circuitry adapted to selectively shift each jth pulse of the reduced frequency timing signal by a first fixed time period.

35 Claims, 4 Drawing Sheets

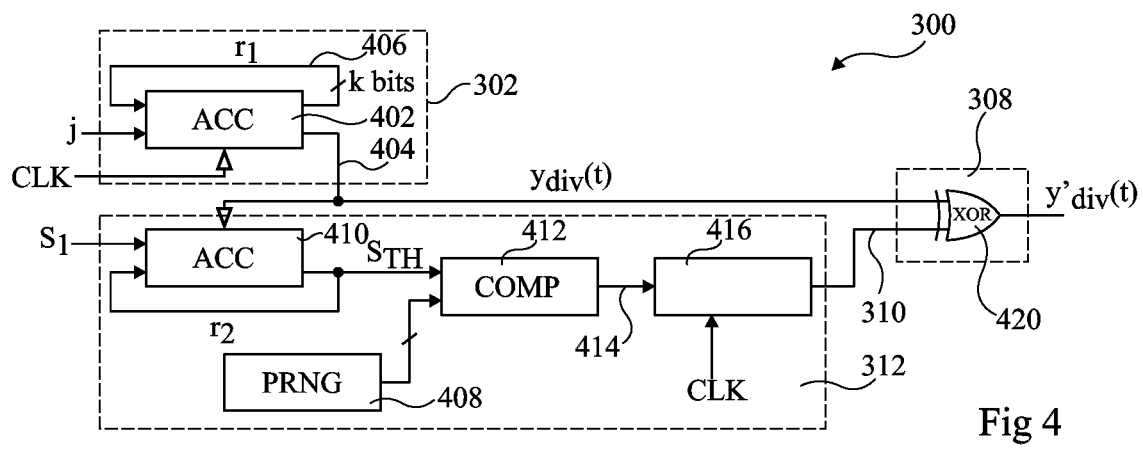
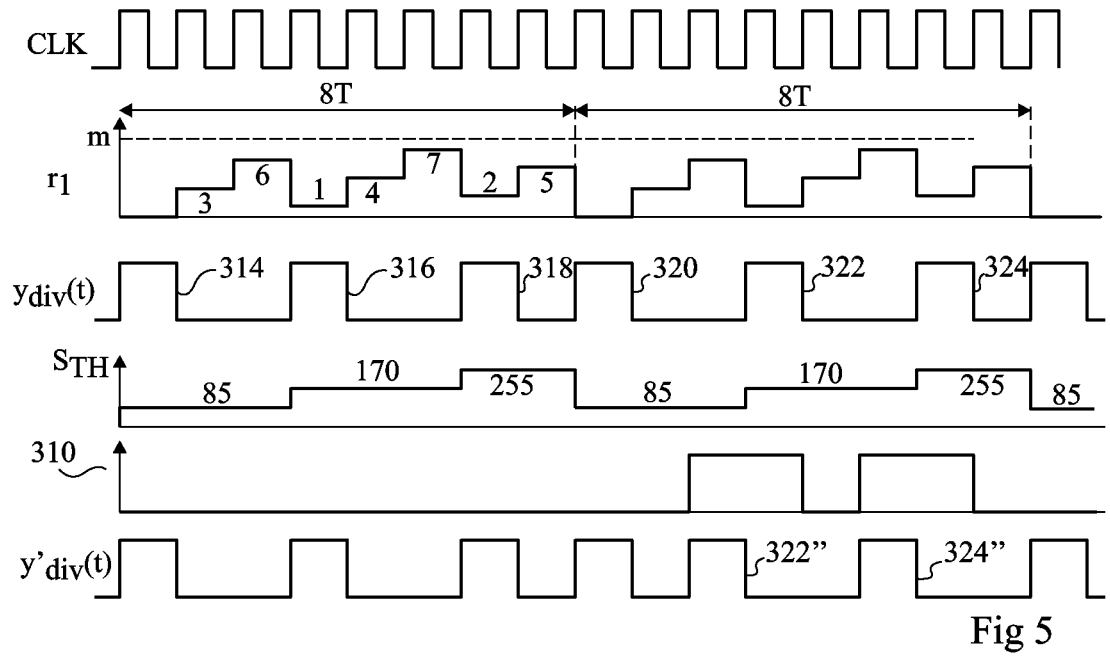
Fig 5
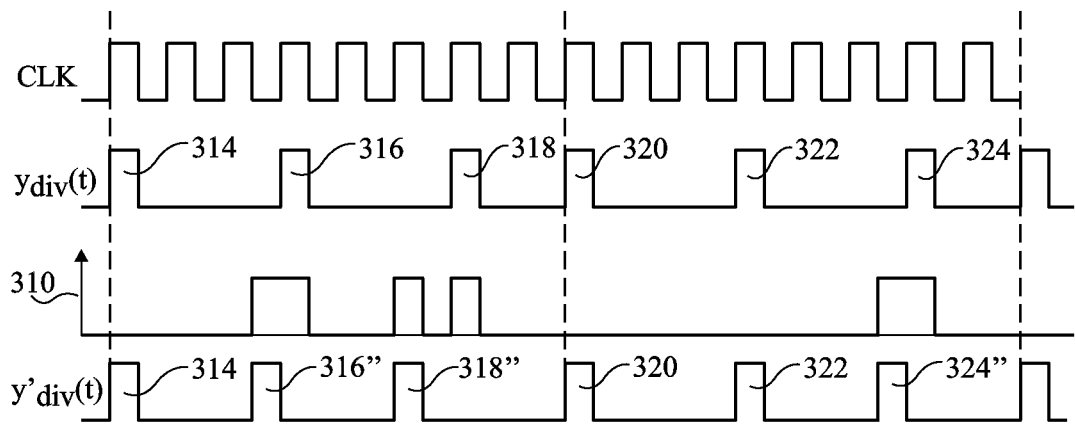
Fig 6

FRACTIONAL FREQUENCY DIVIDER

CROSS REFERENCE TO RELATED APPLICATIONS

This application claims the priority benefit of French patent application number 10/02739, filed on Jun. 30, 2010, entitled FRACTIONAL FREQUENCY DIVIDER, which is hereby incorporated by reference to the maximum extent allowable by law.

BACKGROUND OF THE INVENTION

1. Field of the Invention

The present invention relates to a fractional frequency divider and to a method of fractional frequency division.

2. Discussion of the Related Art

Fractional frequency dividers allow the frequency of a timing signal to be divided by non-integer values. They generally operate by pulse swallowing, in other words by selecting only certain pulses of the original timing signal to be included in the reduced frequency timing signal. This is achieved using an integer divider in which the divisor of the division operation is varied between two or more integer values such that the average divisor has the desired non-integer value.

A challenge with dividing the frequency of a timing signal using fractional frequency dividers is to avoid noise in the frequency bands of interest. Previous attempts to overcome this noise problem involve choosing a certain distribution of the two or more divisor values of the integer divider. However, such solutions tend to be inadequate, and there is thus a need for an improved fractional frequency divider that generates a reduced frequency timing signal with reduced noise in the frequency bands of interest, and without greatly increasing the size and complexity of the frequency divider.

SUMMARY OF THE INVENTION

Embodiments at least partially overcome one or more needs in the prior art.

According to one embodiment, there is provided a fractional frequency divider comprising: a frequency division unit for generating a reduced frequency timing signal having j pulses for every k pulses of an original timing signal, wherein j and k are each integers; and phase correction circuitry adapted to selectively shift each jth pulse of said reduced frequency timing signal by a first fixed time period.

According to one embodiment, the correction circuitry comprises: a pseudo-random number generator; and a comparator adapted to compare, for each jth pulse, a new pseudo-random number generated by said generator with a first threshold value, wherein based on the comparison, said correction circuitry is adapted to control the shifting of each of said jth pulses.

According to another embodiment, the time period between each of said j pulses is equal to an integer multiple of a first time period between each pulse of said original timing signal, and wherein said first fixed time period is equal to said first time period.

According to another embodiment, the correction circuitry comprises circuitry for generating a correction signal based on said comparison, and a logic unit for combining said reduced frequency timing signal with said correction signal to shift said jth pulse.

According to another embodiment, the comparator is further adapted to compare, for the pulse following each jth pulse of said reduced frequency timing signal, a new pseudo-random number generated by said generator with a second threshold value, wherein based on said comparison, the correction circuitry is adapted to selectively shift the pulse following each jth pulse by a second fixed time period.

According to another embodiment, the second threshold value is equal to twice the first threshold value.

According to another embodiment, the first and second thresholds are generated by a modulo n accumulator, wherein the first threshold is equal to n/j, and the second threshold is equal to 2n/j.

According to another embodiment, the frequency division unit comprises a modulo m accumulator adapted to increment a residue value by j on each pulse of said original timing signal.

According to another embodiment, the shift by the first time period advances the pulse.

According to another embodiment, there is provided a phased locked loop comprising the above fractional frequency divider.

According to another embodiment, there is provided an electronic device comprising the above fractional frequency divider.

According to another embodiment, there is provided a method of performing fraction frequency division comprising: generating by a frequency division unit a reduced frequency timing signal having j pulses for every m pulses of an original timing signal, wherein j and m are each integers; and selectively shifting each jth pulse of said reduced frequency timing signal by a first fixed time period.

According to an embodiment, the method further comprises selectively shifting the pulse following each jth pulse of said reduced frequency timing signal by a second fixed period.

According to another embodiment, the step of selectively shifting each jth pulse comprises comparing a pseudo random value with a first threshold value, and shifting said jth pulse based on said comparison.

According to another embodiment, the reduced frequency timing signal has a pulse pattern that repeats every mT periods, T being the period of said original timing signal, and said jth pulse being a second pulse of each of said pulse patterns, wherein the method further comprises selectively shifting a third pulse of each of said pulse patterns following each second pulse based on a comparison of a pseudo-random value and a second threshold value.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which:

FIG. 4 illustrates the fractional frequency divider of FIG. 3A in more detail according to one embodiment;

FIGS. 5 and 6 are timing diagrams showing examples of signals of the fractional frequency divider of FIG. 4;

DETAILED DESCRIPTION

The term "fractional frequency divider" is used herein to designate a frequency divider that performs a division by an irreducible fraction m/j, in other words according to which the resulting reduced frequency timing signal has j pulses for every m pulses of the original timing signal, where m and j are both integers equal to 2 or more.

Figure 1A:
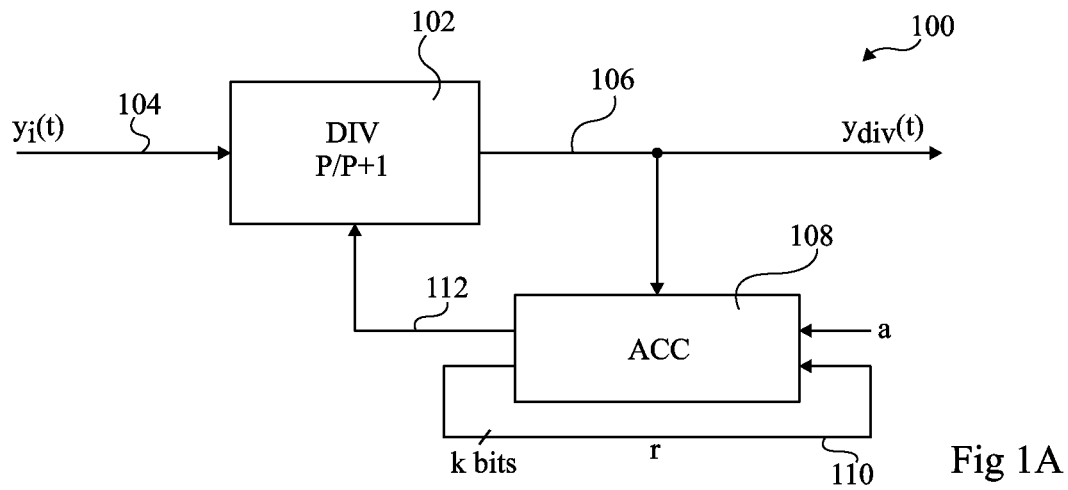
FIG. 1A illustrates an example of a fractional frequency divider.

FIG. 1A illustrates an example of a fractional frequency divider 100 comprising an integer divider 102 that may be controlled to perform a division based on either a divisor P or a divisor P+1. The integer divider 102 receives an original timing signal $y_i(t)$ on an input line 104, and provides a reduced frequency timing signal $y_{div}(t)$ on an output line 106.

An accumulator 108 is used to control the divisor applied by the integer divider 102. In particular, the accumulator 108 increments, on each pulse of the output signal $y_{div}(t)$, a residue value r by a value a. The residue value r is fed back to an input of the accumulator on a k-bit feedback line 110. When the incremented value exceeds the modulo of the accumulator, equal to $2^k$ in this case, the carry-bit on an output line 112 coupled to the divider 102 goes high, and the k-bit residue r contains the remainder.

Figure 1B:
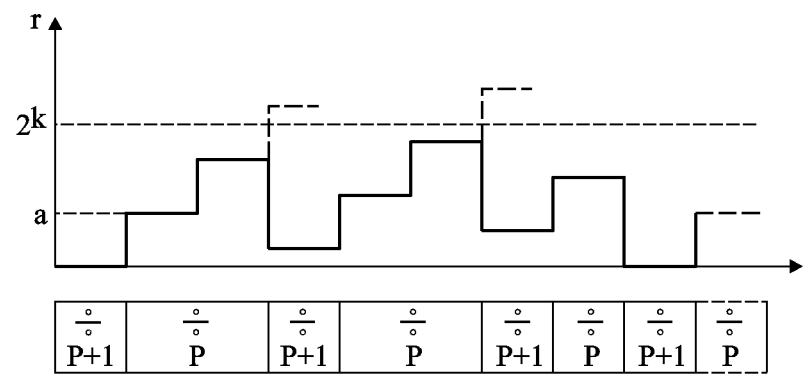
FIG. 1B is a timing diagram illustrating the output signal of the accumulator of FIG. 1A.

FIG. 1B is a timing diagram showing values of the residue signal of the accumulator of FIG. 1A according to an example in which the frequency of the original timing signal is divided by the fraction 2+⅜, equal to 2.375.

As illustrated, the residue r is initially zero, and increases by 3 on each pulse of the output signal $y_{div}(t)$. Thus on the third pulse of the output signal it exceeds the modulo m of the accumulator, and the carry out signal goes high, thereby controlling the divider 102 to divide by P+1 instead of P for one cycle.

A problem with the fraction frequency divider of FIG. 1A is that there will be periodic phase error, leading to spurious tones at the divider output that strongly degrade the performance of the divider.

Figure 2:
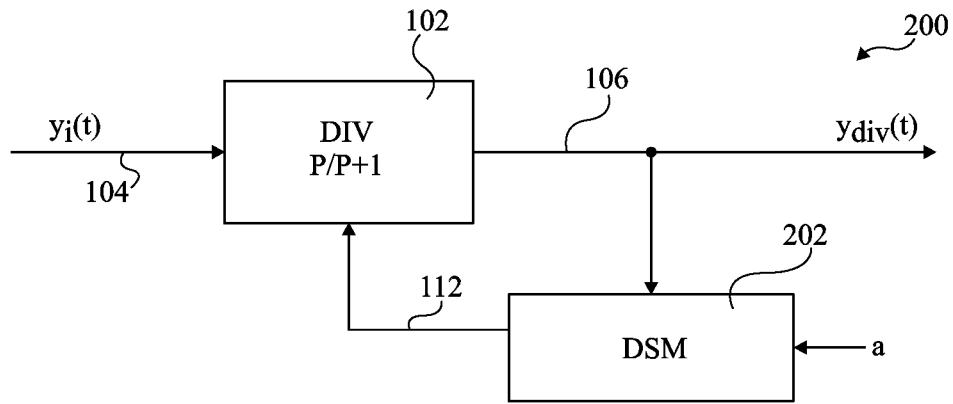
FIG. 2 illustrates an example of another fractional frequency divider.

FIG. 2 illustrates another example of a fractional frequency divider 200, which is the same as divider 100 of FIG. 1A, except that the accumulator 108 has been replaced by a delta sigma modulator (DSM) for controlling the divisor of the integer frequency divider 102.

In this solution, increasing the DSM order improves the noise shaping, but also increases the complexity of the DSM block. Furthermore, this solution tends to push the noise to high frequencies, which in many situations is undesirable.

According to a further non-illustrated alternative solution, a Reinhardt spurless fractional divider applies a random distribution to the division by P or P+1 by the integer divider, by using a random number generator. However, a disadvantage of this solution is that the noise has a flat frequency distribution, which once integrated results in an undesirable noise distribution of $1/f^2$.

Figure 3A:
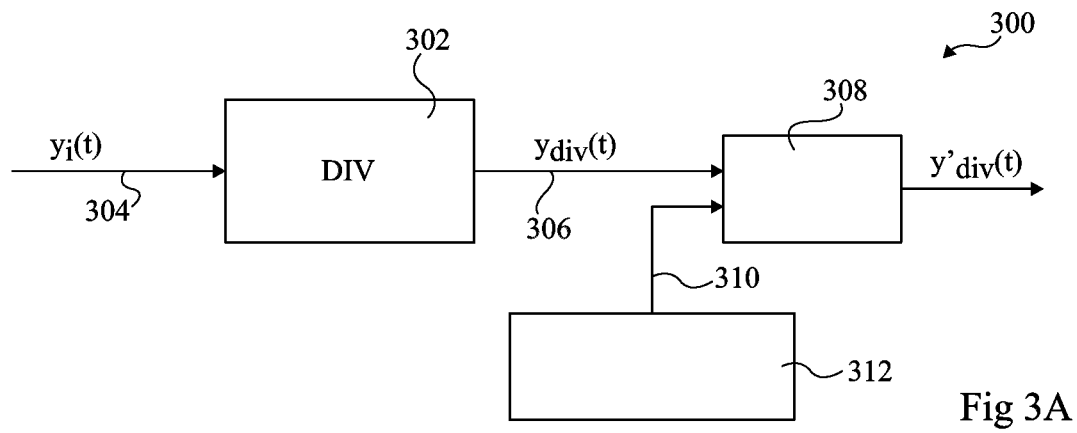
FIG. 3A illustrates a fractional frequency divider according to an embodiment.

FIG. 3A illustrates a fractional frequency divider 300 comprising a fractional division unit 302 for performing a division by a fraction m/j of an original timing signal $y_i(t)$ received on an input line 304. The division unit generates a reduced frequency timing signal $y_{div}(t)$ on an output line 306, which is coupled to phase correction logic 308.

Phase correction logic 308 also receives a phase correction signal on an input line 310, and periodically adjusts the phase of one or more pulses of the reduced frequency timing signal $y_{div}(t)$ based on the phase correction signal to generate the output signal $y'_{div}(t)$. Control circuitry 312 generates the phase correction signal as will now be described in more detail with reference to the timing diagrams of FIGS. 3B and 3C.

Figure 3B:
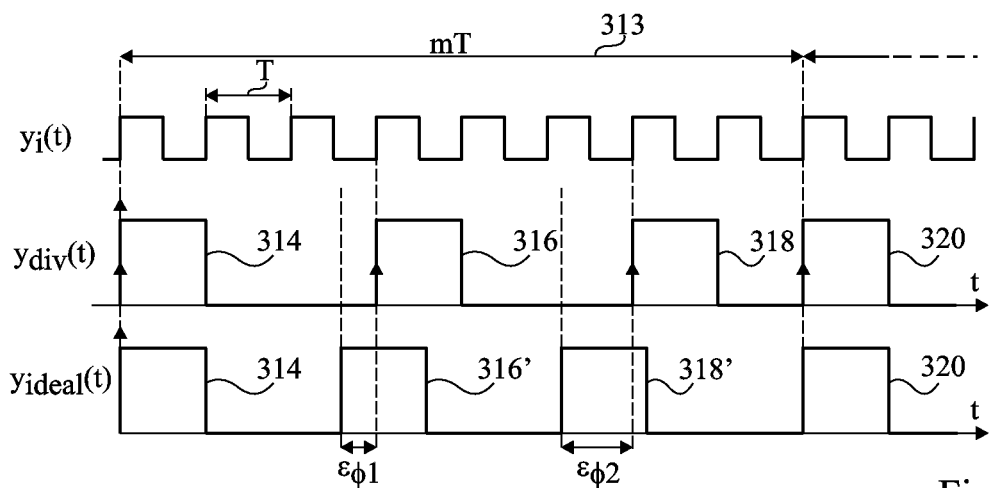
FIGS. 3B and 3C are timing diagrams showing examples of signals of the fractional frequency divider of FIG. 3A.

FIG. 3B illustrates an example of the original timing signal $y_i(t)$ and the reduced frequency timing signal $y_{div}(t)$ in the case that the division fraction m/j is equal to ⅝. Thus, there are three pulses, such as the ones labelled 314, 316 and 318, in the reduced frequency signal $y_{div}(t)$ for each eight pulses of the original timing signal $y_i(t)$. The period of the original timing signal $y_i(t)$ will be designated T, and thus the three pulses 314, 316 and 318 repeat with a periodicity of mT, in this example equal to 8T. A next pulse 320 of the reduced frequency timing signal $y_{div}(t)$ is thus aligned with the end of this 8T period and the start of the next 8T period.

In this example, the pulses of the reduced frequency timing signal $y_{div}(t)$ have rising edges aligned with rising edges of the original timing signal $y_i(t)$, although in some embodiments the divider 302 may be able to align some pulses with the falling edges of the original timing signal.

FIG. 3B also illustrates an ideal reduced frequency timing signal $y_{ideal}(t)$ in which the three pulses are evenly spaced in the time interval 8T. In other words, in the present example, while the rising edges of the pulses 314 and 320 at the start and end of the 8T period remain in the same position in the ideal timing signal, the two intermediate pulses 316, 318 are in new positions 316' and 318', having rising edges spaced by exactly ⅝ periods T of the original timing signal.

The phase error of the pulses 316 and 318 with respect to the ideal positions 316' and 318' are designated as $\epsilon_{\phi 1}$ and $\epsilon_{\phi 2}$ respectively.

FIG. 3C illustrates again the original timing signal $y_i(t)$, and shows the reduced frequency timing signal $y_{div}(t)$ in the case that the first and second pulses 316, 318 are advanced to positions 316", 318", in each case to be aligned with the preceding rising edge of the original timing signal $y_i(t)$. The error of the pulse 316" with respect to the ideally positioned pulse 316' of signal $y_{ideal}(t)$ is designated $\epsilon_{\phi 1'}$, and is equal to $T-\epsilon_{\phi 1}$. Similarly, the error of the pulse 318" with respect to the ideally positioned pulse 318' of signal $y_{ideal}(t)$ is designated $\epsilon_{\phi 2'}$, which is equal to $T-\epsilon_{\phi 2}$.

Because the errors $\epsilon_{\phi 1}$ and $\epsilon_{\phi 1'}$ are opposing, the following relation can be deduced, wherein the values of x and y can be chosen to balance the equation and result in a null average error:

$$x^* \epsilon_{1001} - y^* \epsilon_{\phi 1'} = 0$$

Figure 3C:
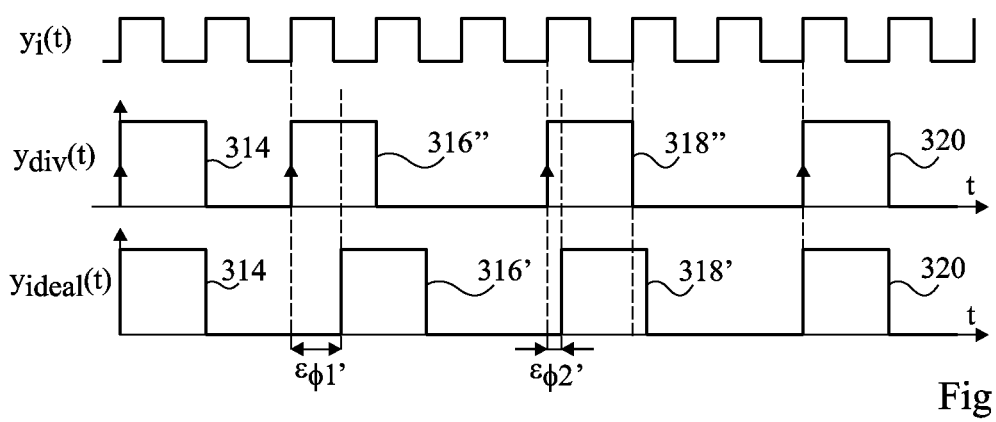

For example, in the case demonstrated in FIGS. 3B and 3C, $\epsilon_{\phi 1}$ is equal to T/3, and $\epsilon_{\phi 1'}$ is equal to 2T/3, and thus x=2y. This means that to obtain a null error, the pulse 316 should be positioned twice as often at position 316 as at position 316".

The phase correction circuitry 312 of FIG. 3A determines periodically, for each pulse 314, 316 of the reduced frequency timing signal $y_{div}(t)$, whether or not to shift the pulse by one period T of the original timing signal to achieve, over a plurality of periods mT, a null average phase error of each pulse. The shift distribution for each pulse could be applied in a number of ways, and an embodiment using a random number generator will now be discussed with reference to FIG. 4.

FIG. 4 illustrates the fractional frequency divider 300 of FIG. 3A in more detail according to one embodiment.

The frequency division unit 302 performs a division of m/j, and comprises in this example an accumulator 402 receiving an original timing signal CLK. On each pulse of clock signal CLK, the accumulator increments a residue value r by value j, and outputs the carry bit on a line 404, which forms the reduced frequency timing signal $y_{div}(t)$. The k-bit residue $r_1$ is provided on a feedback line 406 from an output of the accumulator to the input of the accumulator, to be added again to the value j.

The phase correction circuitry 312 comprises in this example a pseudo-random number generator (PRNG) 408, which for example generates an 8-bit pseudo-random binary value between 0 and 255 for every pulse of the reduced frequency timing signal $y_{div}(t)$. In particular, the PRNG 408 could be clocked by the signal $y_{div}(t)$ or $y'_{div}(t)$, and the number generated on one edge of the signal $y_{div}(t)$ or $y'_{div}(t)$ is used for making the decision for the next edge. The PRNG 408 is for example implemented by one or more linear feedback shift registers as is well known in the art. An accumulator 410 generates a residue output which provides a series $S_{TH}$ of threshold values, one corresponding to each pulse of the reduced frequency timing signal $y_{div}(t)$. Like the pseudo-random number, the threshold values are for example each 8 bits. The threshold sequence $S_{TH}$ and the random-number sequence from PRNG 408 are provided to a comparator 412, which compares them, and outputs a 1-bit signal on an output line 414 indicating whether or not the current threshold value was exceeded by the current random number. Line 414 is coupled to a control block, which generates a low output if the comparator 412 indicates that the current threshold was not exceeded, or generates a signal to shift the corresponding pulse if the comparator 412 indicates that the current threshold was exceeded.

The phase correction logic 308 comprises in this example an XOR gate 420.

An example of the operation of the fractional frequency divider of FIG. 4 will now be described with reference to the timing diagrams of FIG. 5.

In FIG. 5 it is assumed again that the frequency division is by a fraction ⅝.

At the top of FIG. 5 the original timing signal CLK is illustrated. Based on this signal, and the value j, in this example equal to 3, the accumulator 402 generates the residue value r shown in FIG. 5. As illustrated, the residue value starts at zero, and then increments by 3 on each pulse of the clock signal CLK. When the modulo m of the accumulator, equal to 8 in this example, is reached, the carry bit on line 404 is asserted for one period of the clock signal CLK, as shown by the signal $y_{div}(t)$.

The sequence $S_{TH}$ of thresholds is also shown in FIG. 5. In this example the accumulator 410 has a modulo of 255, the increment value is equal to 85, and thus the threshold sequence is 85, 170, 255, 85, 170 etc. .... The first threshold value of 85 is deduced as follows. The accumulator in this example is an 8-bit accumulator, and thus it has modulo of 255. Given the error signals $\epsilon_{\phi 1}$ and $\epsilon_{\phi 1'}$ of pulse 316 discussed above in relation to FIG. 3B, the relation was shown to be x=2y. Thus it follows that:

$$x+y255 \Rightarrow 3y=255 \Rightarrow x=170, y=85$$

This means that the error $\epsilon_{\phi 1'}$, which corresponds to the shifted pulse, should occur once for every two non-shifted pulses, and thus this will be achieved by the threshold of 85.

Generally, the first threshold is for example chosen to equal n/j, where n is the modulo of the accumulator 410, and the irreducible fraction of the division is m/j.

Furthermore, it can be shown that the phase error $\epsilon_{\phi 2}$ of the next pulse 318 will be twice that of the first pulse. Thus the threshold value increments by the same value of 85 for each pulse. This relation will also hold for cases in which there are more than three pulses in each period mT of the original timing signal, the error always incrementing by the same value, and thus the threshold should also increment by this value, equal to the value of the first threshold.

The threshold of 255, which should not be exceeded by the 8-bit pseudo-random number, is used for the pulses 314 and 320 of FIGS. 3B and 3C, and for subsequent pulses occurring at the start of the 8T period, which are never shifted.

FIG. 5 also shows the phase correction signal on line 310 assuming that for pulses 316, 318 of signal $y_{div}(t)$ the respective thresholds of 85 and 170 are not exceeded, but for the occurrences of these pulses, labelled 322 and 324, in the subsequent 8T period the thresholds are exceeded. The phase correction signal for pulses 322 and 324 comprises a high pulse for two periods T of the clock signal CLK, which start one period T before the corresponding pulses 322, 324. In this way, when the phase correction signal is combined by the XOR gate 420, the result is to shift the pulses 322 and 324 to the new positions 322" and 323", one period T earlier.

FIG. 6 illustrates an alternative example, again assuming a fractional frequency division of ⅝, in which the pulses may be shifted by half periods of the clock signal CLK. In this example, the pulses of the reduced frequency timing signal $y_{div}(t)$ have a pulse duration of half a period T of the clock signal CLK. The pulse 316 is shifted to a new position 316" occurring half a period earlier, while the corresponding pulse 322 in the next 8T period is not shifted. Thus the phase error $\epsilon_{\phi 1'}$ of the shifted pulse becomes only T/6. Furthermore, the third pulse is always shifted in this example, by either a full period T as shown by the new position 318" of pulse 318, or by a half period T as shown by the new position 324" of pulse 324. The phase correction signal on line 310 is the signal, when combined with the reduced frequency timing signal $y_{div}(t)$ by XOR gate 420, that results in the appropriate shifts of the pulses in the corrected timing signal $y'_{div}(t)$.

An advantage of providing half-period shifts is that the phase error magnitudes are reduced. However, the phase errors will no longer have the particular relationship of doubling from one pulse to the next, and therefore some additional digital circuitry could be used to adapt the increment value accordingly to generate the appropriate sequence of threshold values, or rather than using an accumulator, the desired threshold sequence is for example simply provided cyclically from a shift register.

It will be apparent to those skilled in the art that rather than a phase shift of a period T or half period T/2 of clock signal CLK, a different phase shift could be provided, for example based on a further timing signal having a fixed phase offset with respect to the original timing signal CLK.

Figure 7:
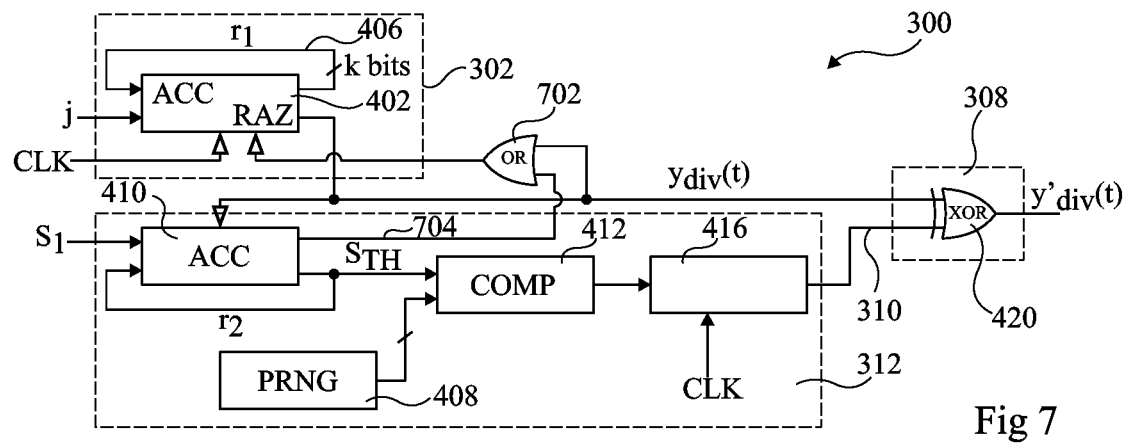
FIG. 7 illustrates the fractional frequency divider of FIG. 3A in more detail according to an alternative embodiment.

FIG. 7 illustrates the fractional frequency divider 300, which is identical to that of FIG. 4, except that an additional OR gate 702 is provided for controlling a reset to zero input RAZ of the accumulator 402. The two inputs of OR gate 702 are coupled respectively to a carry out of the accumulator 410 on a line 704, and the reduced frequency timing signal $y_{div}(t)$. In this implementation, the accumulator is used as a P/P+1 divider, and the signals provided to the OR-gate inputs are used to reset the accumulator such that it switches from P to P+1.

Figure 8:
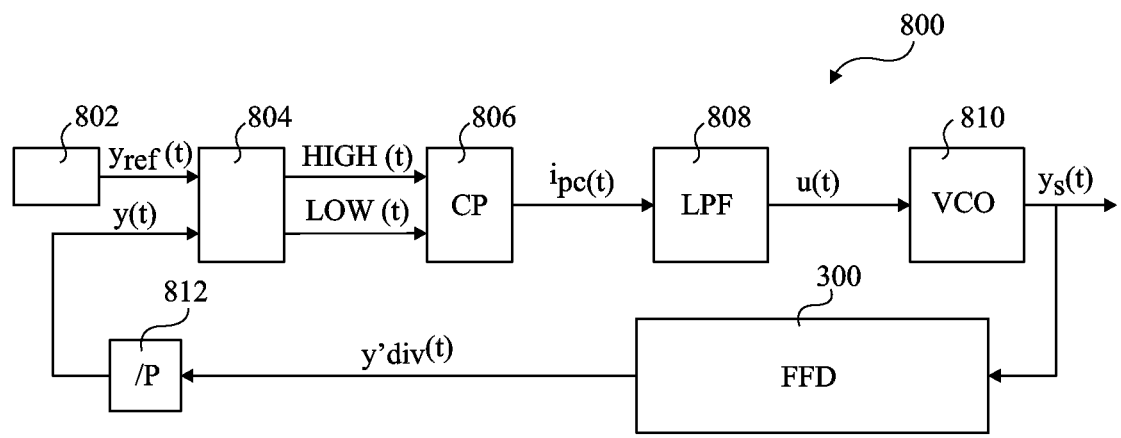
FIG. 8 illustrates a phase-locked loop (PLL) according to an embodiment.

FIG. 8 illustrates a phase-locked loop 800 comprising the fractional frequency divider 300 of FIG. 3A, 4, or 7.

A source 802, which is for example a crystal oscillator, provides a reference timing signal $y_{ref}(t)$ to a phase frequency detector (PFD) 804. The PFD 804 generates high and low phase error output signals HIGH(t) and LOW(t) based on a detected phase difference between the reference timing signal $y_{ref}(t)$ and a feedback signal y(t). The signals HIGH(t) and LOW(t) are provided to a charge pump 806, which generates a current signal $i_{pc}(t)$ provided to a low pass filter (LPF) 808. The low pass filter provides a filtered signal u(t), which is provided to a voltage controlled oscillator (VCO) 810, which in turn provides a timing signal $y_s(t)$ at a frequency equal to a non-integer multiple of the reference signal $y_{ref}(t)$.

The timing signal $y_s(t)$ is then divided by the fractional frequency divider 300, which includes phase correction circuitry, to generate the reduced frequency timing signal $y'_{div}(t)$. Signal $Y_{div}(t)$ is then for example provided to a divider 812 for division by an integer value P before being fed back to the phase frequency detector 804 as the feedback signal y(t).

Figure 9:
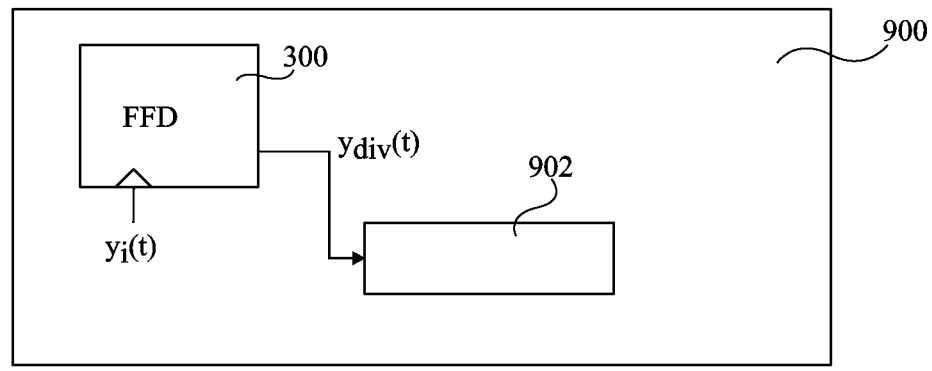
FIG. 9 illustrates an electronic device according to an embodiment.

FIG. 9 illustrates an electronic device 900 comprising the fractional frequency divider 300, which receives an input timing signal $y_i(t)$, and generates the reduced frequency timing signal $y'_{div}(t)$. Signal $y'_{div}(t)$ is provided to circuitry 902 of the electronic device, which could be a phased locked loop or other circuitry that makes use of the phase corrected timing signal.

The electronics device 900 is for example a wireless device such as a communications handset, wireless router, navigation system, Bluetooth device etc.

An advantage of fractional frequency divider described herein is that it avoids spurious tones by removing the periodicity of the phase error, achieve by providing a null average phase error. This greatly improves the noise characteristics of the reduced frequency output timing signal.

Furthermore, the solution can be implemented digitally, without greatly increasing the size or complexity of the fractional frequency divider.

When used in a phase-locked loop, the fractional frequency divider described herein allows the bandwidth of the PLL to be greatly increased without increasing the loop filter order, and without the need of additional noise reduction techniques.

While a number of specific embodiments have been described herein, it will be apparent to those skilled in the art that various modifications could be applied.

For example, while the phase correction is, for example, implemented by an XOR gate 420, in alternative embodiments other logic functions could be used to adjust the phase of certain pulses of the reduced frequency timing signal, as will be apparent to those skilled in the art.

Furthermore, it will be apparent to those skilled in the art that while the fractional division unit 302 can be implemented by an accumulator, other implementations are possible, such as using an integer divider that applies one of two or more integer divisors based on a control circuit, as described in relation to FIG. 1.

Furthermore, while a pseudo-random number generator could be used to determine the distribution of fixed phase shifts to be applied to achieve the desired average pulse positions, other solutions are possible. For example, the control block 312 of FIG. 3A could comprise a memory storing a phase correction sequence corresponding to a relatively high number of pulses, and this sequence could be periodically repeated. The choice between using such a memory, or using an accumulator, will depend on the number of edges to be shifted, and for example when a relatively high number of edges are to be shifter, an accumulator is preferable.

Furthermore, it will be apparent to those skilled in the art that there may be one or more alternative phase shifts that are selectively applied to a given pulse. Also, while in the described embodiments the erroneous pulses of the reduced frequency timing signal are delayed with respect to the ideal timing signal, and the phase of these pulses is corrected by advancing these pulses by a fixed time period at least some of the time, it will be apparent to those skilled in the art that alternatively the erroneous pulses could be in advance of their ideal positions, and the phase correction could be to delay these pulses by a fixed period.

It will be apparent to those skilled in the art that the PLL of FIG. 8 illustrates just one example of a PLL comprising the fractional frequency divider described herein, and that other PLL implementations comprising this divider would be possible.

It will also be apparent to those skilled in the art that the various embodiments described herein could be combined in alternative embodiments in any combination.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A fractional frequency divider comprising:
   a frequency division unit for generating a reduced frequency timing signal having j pulses for every m pulses of an original timing signal, wherein j and m are each integers; and
   phase correction circuitry adapted to selectively shift each jth pulse of said reduced frequency timing signal by a first fixed time period, wherein selectively shifting comprises a comparison between a first threshold value and a first generated value, wherein said first threshold is generated by a modulo n accumulator, wherein said first threshold is equal to 2n/j.

2. The fractional frequency divider of claim 1, wherein said phase correction circuitry comprises:
   a pseudo-random number generator; and
   a comparator adapted to compare, for each jth pulse, said first generated value, wherein said first generated value comprises a first new pseudo-random number, generated by said generator, with said first threshold value, wherein based on the comparison, said correction circuitry is adapted to control the shifting of each of said jth pulses.

3. The fractional frequency divider of claim 2, wherein a time period between each of said j pulses is equal to an integer multiple of a first time period between each pulse of said original timing signal, and wherein said first fixed time period is equal to said first time period.

4. The fractional frequency divider of claim 2, wherein said phase correction circuitry comprises circuitry for generating a correction signal based on said comparison, and a logic unit for combining said reduced frequency timing signal with said correction signal to shift said jth pulse.

5. The fractional frequency divider of claim 2, wherein said comparator is further adapted to compare, for the pulse preceding each jth pulse of said reduced frequency timing signal, a second new pseudo-random number generated by said generator with a second threshold value, wherein based on said comparison, said phase correction circuitry is adapted to selectively shift the pulse preceding each jth pulse by a second fixed time period.

6. The fractional frequency divider of claim 5, wherein said second threshold value is equal to half the first threshold value.

7. The fractional frequency divider of claim 5, wherein said second threshold is generated by the modulo n accumulator, wherein said second threshold is equal to n/j.

8. The fractional frequency divider of claim 1, wherein said frequency division unit comprises a modulo m accumulator adapted to increment a residue value by j on each pulse of said original timing signal.

9. The fractional frequency divider of claim 1, wherein said shift by said first time period advances said pulse.

10. A phased locked loop comprising the fractional frequency divider of claim 1.

11. An electronic device comprising the fractional frequency divider of claim 1.

12. A method of performing fractional frequency division comprising:
generating by a frequency division unit a reduced frequency timing signal having j pulses for every m pulses of an original timing signal, wherein j and m are each integers; and
selectively shifting each jth pulse of said reduced frequency timing signal by a first fixed time period, wherein selectively shifting comprises a comparison between a first threshold value and a first generated value, wherein said first threshold is generated by a modulo n accumulator, wherein said first threshold is equal to 2n/j.

13. The method of claim 12, further comprising selectively shifting the pulse preceding each jth pulse of said reduced frequency timing signal by a second fixed period.

14. The method of claim 12, wherein said step of selectively shifting each jth pulse comprises comparing said first generated value, wherein said first generated value comprises a first pseudo random value, with said first threshold value, and shifting said jth pulse based on said comparison.

15. The method of claim 14, wherein said reduced frequency timing signal has a pulse pattern that repeats every mT periods, T being the period of said original timing signal, and said jth pulse being a third pulse of each of said pulse patterns, wherein the method further comprises selectively shifting a second pulse of each of said pulse patterns preceding each third pulse based on a comparison of a second pseudo-random value and a second threshold value.

16. A fractional frequency divider comprising:
a fractional frequency division unit for generating a reduced frequency timing signal having j pulses for every m pulses of an original timing signal, wherein j and m are each integers whose ratio is a non-integer; and
phase correction circuitry adapted to selectively shift each jth pulse of said reduced frequency timing signal by a first fixed time period, wherein the first fixed time period is equal to a period of the original timing signal.

17. The fractional frequency divider of claim 16, wherein said phase correction circuitry comprises:
a pseudo-random number generator; and
a comparator adapted to compare, for each jth pulse, a first new pseudo-random number, generated by said generator, with a first threshold value, wherein based on the comparison, said correction circuitry is adapted to control the shifting of each of said jth pulses.

18. The fractional frequency divider of claim 17, wherein a time period between each of said j pulses is equal to an integer multiple of the period between each pulse of said original timing signal.

19. The fractional frequency divider of claim 17, wherein said phase correction circuitry comprises circuitry for generating a correction signal based on said comparison, and a logic unit for combining said reduced frequency timing signal with said correction signal to shift said jth pulse.

20. The fractional frequency divider of claim 17, wherein said comparator is further adapted to compare, for the pulse preceding each jth pulse of said reduced frequency timing signal, a second new pseudo-random number generated by said generator with a second threshold value, wherein based on said comparison, said phase correction circuitry is adapted to selectively shift the pulse preceding each jth pulse by a second fixed time period.

21. The fractional frequency divider of claim 20, wherein said second threshold value is equal to half the first threshold value.

22. The fractional frequency divider of claim 20, wherein said first and second thresholds are generated by a modulo n accumulator, wherein said first threshold is equal to 2n/j, and said second threshold is equal to n/j.

23. The fractional frequency divider of claim 16, wherein said fractional frequency division unit comprises a modulo m accumulator adapted to increment a residue value by j on each pulse of said original timing signal.

24. The fractional frequency divider of claim 16, wherein said shift by said first fixed time period advances said pulse.

25. A phased locked loop comprising the fractional frequency divider of claim 16.

26. An electronic device comprising the fractional frequency divider of claim 16.

27. A method of performing fractional frequency division comprising:
generating by a fractional frequency division unit a reduced frequency timing signal having j pulses for every m pulses of an original timing signal, wherein j and m are each integers whose ratio is a non-integer; and
selectively shifting each jth pulse of said reduced frequency timing signal by a first fixed time period, wherein selectively shifting each jth pulse comprises comparing a first pseudo random value with a first threshold value and shifting said jth pulse based on said comparison.

28. The method of claim 27, further comprising selectively shifting the pulse preceding each jth pulse of said reduced frequency timing signal by a second fixed period.

29. The method of claim 27, wherein said reduced frequency timing signal has a pulse pattern that repeats every mT periods, T being the period of said original timing signal, and said jth pulse being a third pulse of each of said pulse patterns, wherein the method further comprises selectively shifting a second pulse of each of said pulse patterns preceding each third pulse based on a comparison of a second pseudo-random value and a second threshold value.

30. A fractional frequency divider comprising:
a fractional frequency division unit for generating a reduced frequency timing signal having j pulses for every m pulses of an original timing signal, wherein j and m are each integers whose ratio is a non-integer; and
phase correction circuitry adapted to selectively shift each jth pulse of said reduced frequency timing signal by a first fixed time period, wherein said phase correction circuitry comprises:
a pseudo-random number generator; and
a comparator adapted to compare, for each jth pulse, a first new pseudo-random number, generated by said generator, with a first threshold value, wherein based on the comparison, said correction circuitry is adapted to control the shifting of each of said jth pulses.

31. The fractional frequency divider of claim 30, wherein a time period between each of said j pulses is equal to an integer multiple of a first time period between each pulse of said original timing signal, and wherein said first fixed time period is equal to said first time period.

32. The fractional frequency divider of claim 30, wherein said phase correction circuitry comprises circuitry for generating a correction signal based on said comparison, and a logic unit for combining said reduced frequency timing signal with said correction signal to shift said jth pulse.

33. The fractional frequency divider of claim 30, wherein said comparator is further adapted to compare, for the pulse preceding each jth pulse of said reduced frequency timing signal, a second new pseudo-random number generated by said generator with a second threshold value, wherein based on said comparison, said phase correction circuitry is adapted to selectively shift the pulse preceding each jth pulse by a second fixed time period.

34. The fractional frequency divider of claim 33, wherein said second threshold value is equal to half the first threshold value.

35. The fractional frequency divider of claim 33, wherein said first and second thresholds are generated by a modulo n accumulator, wherein said first threshold is equal to 2n/j, and said second threshold is equal to n/j.

\* \* \* \* \*

UNITED STATES PATENT AND TRADEMARK OFFICE
CERTIFICATE OF CORRECTION

PATENT NO. : 8,867,696 B2
APPLICATION NO. : 13/172491
DATED : October 21, 2014
INVENTOR(S) : Nicolas Regimbal et al.

It is certified that error appears in the above-identified patent and that said Letters Patent is hereby corrected as shown below:

In the Specification:

In Column 4, Line 53, "$x^{*}\epsilon 100\ 1^{-y^{*}\epsilon}\phi 1'=0$" should read -- $x^{*}\epsilon\phi 1^{-y^{*}\epsilon}\phi 1'=0$ --; and In Column 5, Line 60, "x+y255 ⇒ 3y=255 ⇒ x=170,y=85" should read --x+y=255 ⇒ 3y=255 ⇒ x=170, y=85--.

Signed and Sealed this
Third Day of February, 2015

Michelle K. Lee
*Deputy Director of the United States Patent and Trademark Office*